United States Patent [19]

Iwasawa et al.

[11] Patent Number: 4,867,629

[45] Date of Patent: Sep. 19, 1989

[54] DUSTTIGHT STORAGE CABINET APPARATUS FOR USE IN CLEAN ROOMS

[75] Inventors: Yoshiyuki Iwasawa; Tsutomu Ishida; Hiroshi Harada; Kenji Okamoto; Shintaro Kobayashi, all of Tokyo; Takashi Matsumoto; Tsutomu Shinya, both of Ise; Shigeru Tanaka; Toshio Takasu, both of Ise; Kiwamu Yamamoto, Ise, all of Japan

[73] Assignees: Shimizu Construction Co., Ltd., Tokyo; Shinko Electric Co. Ltd., Mie, both of Japan

[21] Appl. No.: 123,313

[22] Filed: Nov. 20, 1987

[30] Foreign Application Priority Data

Nov. 20, 1986 [JP] Japan .................................. 61-277057
Nov. 20, 1986 [JP] Japan .......................... 61-178722[U]
Mar. 16, 1987 [JP] Japan .................................. 62-60776

[51] Int. Cl.$^4$ ............................................. B65G 1/133
[52] U.S. Cl. .................................. 414/331; 98/115.3;
211/41; 211/163; 414/217
[58] Field of Search ............... 414/331, 787, 217, 277;
211/163, 144, 131, 41; 98/115.3

[56] References Cited

U.S. PATENT DOCUMENTS

| | | | |
|---|---|---|---|
| 3,902,773 | 9/1975 | Gondek | 414/787 |
| 4,269,124 | 5/1981 | Rosenthal et al. | 211/163 X |
| 4,293,249 | 10/1981 | Whelan | 414/217 X |
| 4,659,281 | 4/1987 | Aupperle | 414/787 |
| 4,676,144 | 6/1987 | Smith, III | 98/115.3 X |
| 4,699,554 | 10/1987 | Kawashima et al. | 414/217 |
| 4,701,096 | 10/1987 | Fisher, Jr. | 414/331 X |
| 4,723,480 | 2/1988 | Yagi et al. | 98/115.3 |

FOREIGN PATENT DOCUMENTS

| | | | |
|---|---|---|---|
| 186808 | 10/1984 | Japan | 414/331 |
| 52405 | 3/1985 | Japan | 414/331 |
| 131845 | 6/1986 | Japan | 414/331 |

Primary Examiner—David A. Bucci
Attorney, Agent, or Firm—Scully, Scott, Murphy & Presser

[57] ABSTRACT

There is disclosed a dusttight storage cabinet apparatus used for storing works such as wafer cassettes for containing semiconductor wafers. The storage cabinet apparatus includes: a housing having an entrance, formed in its front wall, for allowing works to come in and go out of the housing therethrough; an air supply duct for supplying the inside of the housing with clean air; a vertical rotation shaft rotatably disposed in the housing for turning about its longitudinal axis; a drive motor for turning the rotation shaft; and a rack assembly of a substantially cylindrical structure. The rack assembly is coaxially secured to the rotation shaft and has a plurality of compartments for storing the works therewithin. The compartments open radially outward and are partitioned off from one another so as to prevent cross contamination by dust among the compartments.

15 Claims, 10 Drawing Sheets

Fig. 1

(Prior Art)

DUSTTIGHT STORAGE CABINET APPARATUS FOR USE IN CLEAN ROOMS

BACKGROUND OF THE INVENTION

This invention relates to a storage cabinet apparatus used in clean rooms in which, for example, semiconductor devices are fabricated, the storage cabinet apparatus being used for temporarily storing works such as wafer cassettes containing semiconductor wafers.

In the fabrication processes of semiconductor devices such as VLSIs and ICs, in particular, in the pretreatment process in which circuit elements are formed on semiconductor wafers, the occurrence of dust in workrooms is a serious obstruction to the desired high yield of semiconductor devices. That is to say, the yield of the semiconductor devices is severely influenced by the cleanliness of the workroom's atmosphere. Therefore, it is preferable that the workrooms used for fabricating semiconductor devices are clean rooms of a cleanliness (which is determined by the number of dust particles contained in a unit volume of atmosphere) higher than a predetermined level. For the same reason, it is required that storage cabinets have the same or higher cleanliness than that of the workrooms. The storage cabinets are cabinets being used in the work rooms for storing wafer cassettes temporarily. Wafer cassettes are stored in these cabinets, for example, when the cassettes are not being used or when the semiconductor wafers contained in the wafer cassettes must wait for the next fabrication process.

Figure 1:
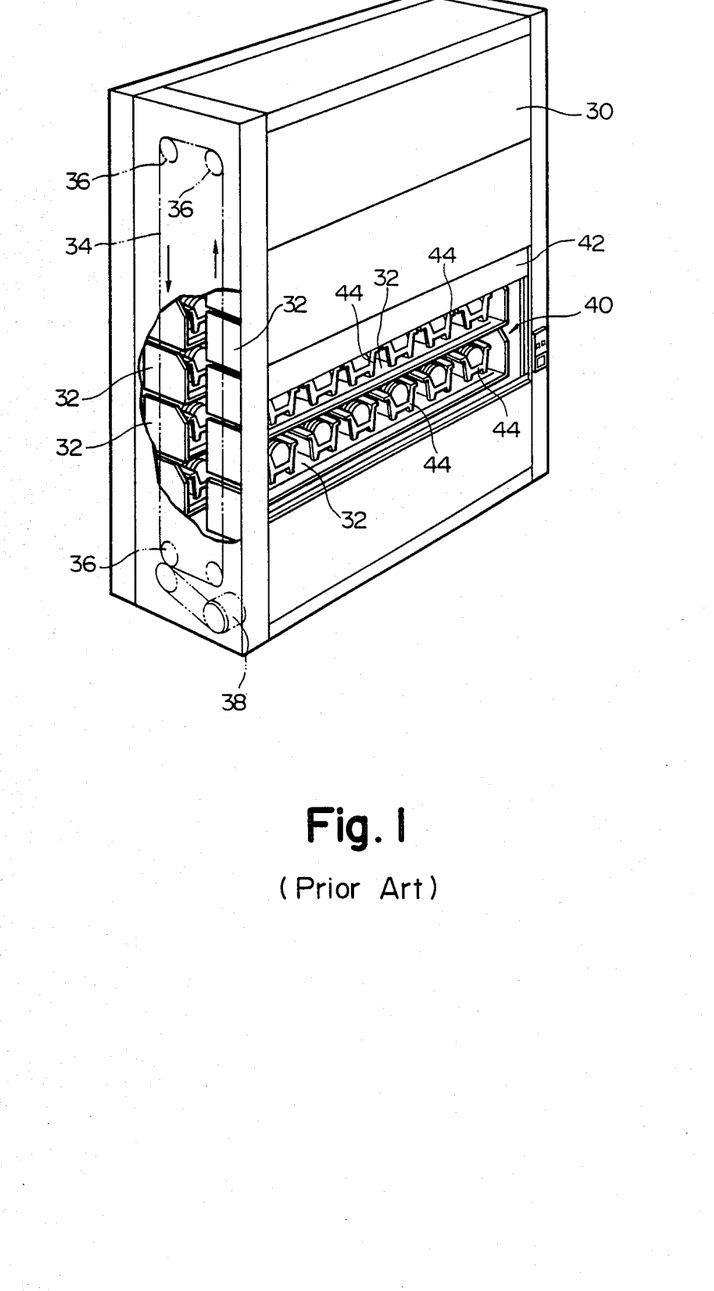
FIG. 1 is a perspective view, partly cut away, of a conventional storage cabinet apparatus.

FIG. 1 illustrates a typical example of the conventional storage cabinet which has a generally rectangular box-like housing 30 with an elongated entrance 40 extending from side to side. This entrance 40 is provided with a sliding shutter 42 which is driven vertically by a suitable means such as a motor (not shown). In the housing 30, a plurality of horizontal trays 32 are connected by endless chains or sprockets 34 in such a manner that the trays 32 are drawn in an endless line. The trays 32 are adapted to support a plurality of works such as wafer cassettes 44 in which semiconductor wafers are contained. The chains 34 are routed around a plurality of guide wheels 36 rotatably connected to the housing 30. One of the guide wheels 36 is drivingly connected to an electric motor 38 which is secured to the bottom section of the housing 30, and thereby when the motor 38 is actuated, the trays 2 are driven in a direction indicated by the arrows in FIG. 1. In the housing 30, a clean air flow is directed downward to the bottom of the housing 30 or forward to the entrance 40 by a blower so that dust occurring in the housing 30 is immediately discharged out of the housing 30. In order to have the wafer cassettes put into or taken out of the storage cabinet, a desired tray 32 is brought to a position horizontally adjoining the entrance 40. Then, the shutter 42 is opened and the wafer cassettes 44 are put onto or taken off the tray 32 by workers.

However, since the aforementioned conventional storage cabinet is of a structure such that the air flow is directed downward or forward to go through the entire housing 30, dust created in the upper or back area of the inside of the housing 30 is blown throughout the lower or front area of the inside of the housing. That is to say, there arises the potential inconvenience of many semiconductor wafers being contaminated by the dust occurring at one wafer cassette in the housing or at a part of the cabinet such as the chains 34 and the motor 38. Also, since the width of the entrance 40 is as large as the entire length of a tray 32, not only one wafer cassette 44 which is to be put in or taken out of the housing 30 but also all the other wafer cassettes 44 on the same tray 32 are exposed to the external atmosphere upon the opening operation of the shutter 42. This fact may increase the potential of the semiconductor wafers to be contaminated by outside dust such as dust carried by the workers. Although these problems mentioned above can be solved by employing a cassette case which is capable of hermetically encasing each wafer cassette 44, such a cassette case is likely to be an obstacle to the wafer cassettes' automatic transportation which is desired in clean rooms.

SUMMARY OF THE INVENTION

Accordingly, it is an object of the present invention to provide a storage cabinet apparatus which has less potential for producing dust in the housing than the conventional storage cabinet.

Another object of the present invention is to provide a storage cabinet apparatus in which even if dust occurs in the housing, the dust is not blown throughout the housing.

A further object of the present invention is to provide a storage cabinet apparatus in which the stored semiconductor wafers are prevented from contamination by outside dust entering through the entrance on the housing.

With these and other objects in view, the present invention provides a dust tight storage cabinet apparatus comprising: a housing having a first entrance, formed in its front wall, for allowing works to come in and go out of the housing through the first entrance; air supply means for supplying the inside of the housing with clean air; a vertical rotation shaft rotatably disposed in the housing for turning about its longitudinal axis; first drive means for turning the rotation shaft; and a rack assembly of a substantially cylindrical structure. The rack assembly is coaxially secured to the rotation shaft, and has a plurality of compartments for storing the works therewithin. The compartments open radially outward and are partitioned off from one another so as to prevent cross contamination by dust among the compartments.

The rack assembly may include: a cylindrical support frame concentrically connected to the rotation shaft; a plurality of parallel annular trays attached around the support frame at equal vertical spacings; and a plurality of radial plates extending between adjoining two trays so that every space between adjoining two trays is divided by the radial plates into a plurality of the compartments. Alternatively, the rack assembly may include a plurality of rack segments connected to one another to form the substantially cylindrical structure. Each of the rack segments may be a substantially rectangular box-like structure with an open outer end, which define one of the compartments therewithin.

It is preferred that the storage cabinet has a partition wall dividing the inside of the housing into a front chamber and a rear chamber. The front chamber is in communication with the outside of the housing through the first entrance, while the rear chamber receives the rotation shaft and the rack assembly. In this case, the partition wall has a second entrance for allowing works to go between the front and rear chambers therethrough. Thus, the rear chamber is in communication with the front chamber through the second entrance. It is also preferred that the storage cabinet has transfer means, disposed in the front chamber, for transporting works between the first entrance and rack assembly. This transfer means may include: a vertical guide rail rotatably disposed in the front chamber for turning about a longitudinal axis thereof; a slider member slidably connected to the guide rail for movement along the guide rail; a horizontal arm extending horizontally from the slider member; and a clamping hand, attached to the distal end of the horizontal arm, for releasably clamping the works. The horizontal arm may be a telescopic structure such that the horizontal arm is horizontally extensible and contractible.

The first drive means may be a linear motor which consists of an annular secondary conductive body coaxially attached to the rotation shaft, and a plurality of primary coils disposed in the housing in such a manner that the primary coils confront the secondary conductive body.

It is preferred that each of the compartments has an air inlet in communication with the air supply means so that clean air is introduced into each of the compartments through the corresponding air inlet. The air inlet may have an air filter for filtrating air passing through the air inlet. The compartments are provided with covering means for covering upper portions of the openings of the compartments so that each of the lower portions of the openings serves as an air outlet for each of the compartments.

Each of the compartments may have upper and lower inner faces. The air inlet is formed in the upper inner face of each of the compartments so that air flow in each of the compartments is driven downward to the corresponding lower inner face. The lower inner face of each of the compartments slopes down to the corresponding air outlet so as to smoothly guide the air flow toward the air outlet.

The covering means may be a cylindrical inner wall concentrically surrounding the rack assembly. The inner wall includes: a third entrance, formed in that portion of the inner wall adjacent to the first entrance of the housing, for allowing works to go therethrough; and a plurality of apertures formed in those portions of the inner wall in front of the compartments so that the apertures allow the lower portions of the opening of the compartments to be kept open. Alternatively, the covering means may be a plurality of swing doors. Each swing door is pivotally connected to the rack assembly in such a manner that the openings of one or more of the compartments are opened and closed by the pivotal movement of each of the swing doors. Each of the swing doors may have one or more apertures for allowing the lower portions of the openings of the corresponding compartments to be kept open.

DETAILED DESCRIPTION OF THE PREFERRED EMBODIMENTS

Referring to FIGS. 2 to 17, wherein like reference characters designate corresponding parts throughout several views, and descriptions of the corresponding parts are omitted once given.

Figure 2:
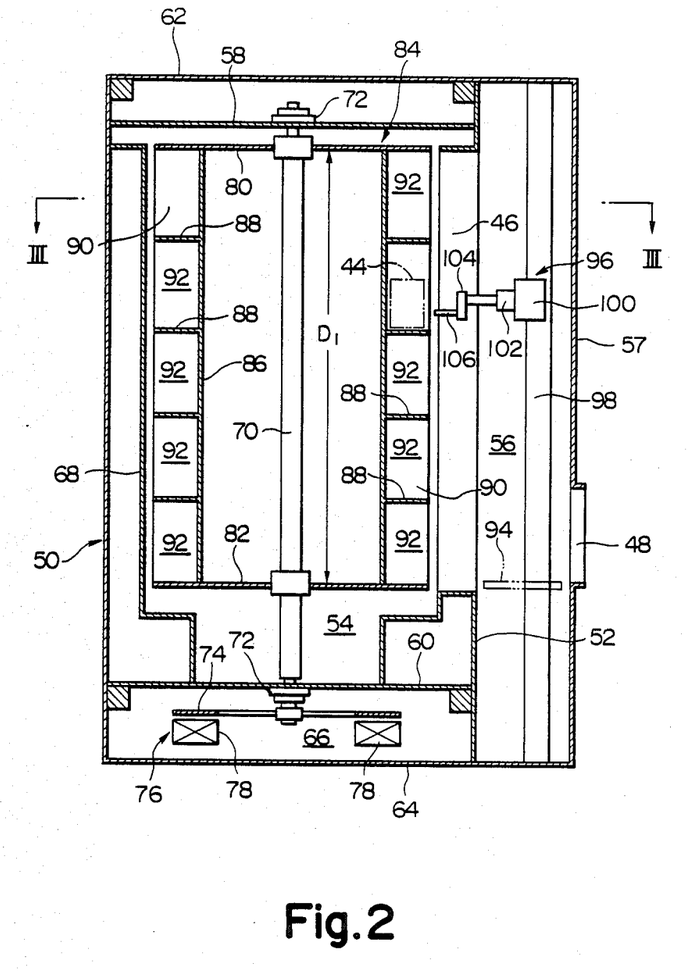
FIG. 2 is a schematic vertical sectional view of a storage cabinet apparatus according to the present invention.
Figure 3:
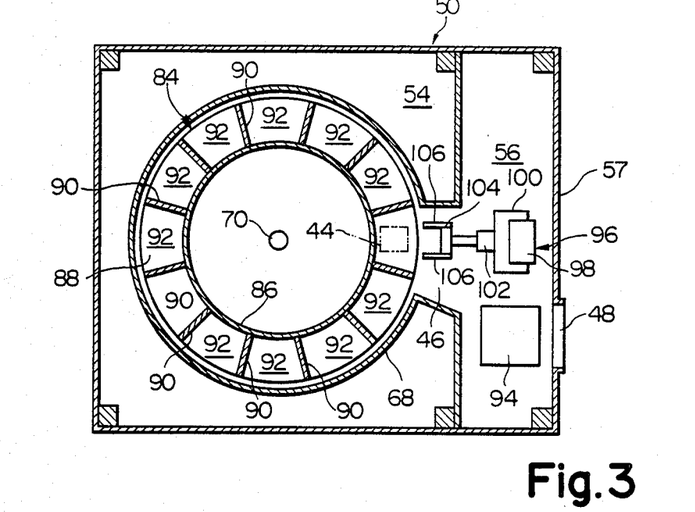
FIG. 3 is a view taken along the line III—III in FIG. 2.

FIGS. 2 and 3 show a storage cabinet apparatus according to the present invention, in which the inner space of a rectangular box-like housing 50 is divided by a partition wall 52 into a storage chamber 54 and a transfer chamber 56. The transfer chamber 56 is in communication with the outside of the housing 50 through an outer entrance 48 which is formed in the front wall 57 of the housing 50. The size of the outer entrance 48 is such that the outer entrance 48 allows only one work such as a wafer cassette 44 to go therethrough. Also, the transfer chamber 56 is in communication with the inside of an inner wall 68 (which is described later on) of the storage chamber 54 through a vertically elongated inner entrance 46 which is formed through the partition wall 52 and the cylindrical inner wall 68. The vertical length of the inner entrance 46 is as long as the axial length of a rack assembly described later on. The storage chamber 54 is supplied with clean air by such suitable means as a blower with an air filter, which enables the cleanliness of the storage chamber 54 to be kept above a predetermined level. The transfer chamber 56 is also provided with suitable means such as an air supply duct (not shown) for constantly supplying clean air into transfer chamber 56 and with suitable means such as an exhaust duct (not shown) for discharging dust out of the transfer chamber 56.

As shown in FIG. 2, the storage chamber 54 is provided with a ceiling panel 58 and a base panel 60, both being secured to the inner face of the housing 50 and respectively confronting the top and bottom walls 62 and 64 of the housing 50. A motor room 66 is defined by the base panel 60 and the bottom wall 64 of the housing 50. A cylindrical inner wall 68 is disposed upright between the ceiling panel 58 and the base panel 60, and secured to the base panel 60 and the inner face of the housing 50. In this cylindrical inner wall 68, a rotation shaft 70 is coaxially disposed, and is rotatably connected at its opposite end portions to the ceiling and base panels 58 and 60 respectively. Reference numeral 72 designates bearings which rotatably support the opposite end portions of the rotation shaft 70. Each of these bearings 72 has a sealing magnetic fluid unit (not shown) which prevents dust from being released into the storage chamber 54. The lower end portion of the rotation shaft 70 extends into the motor room 66 and is provided coaxially with an annular secondary conductive body 74. A plurality of primary coils 78 are fixedly connected to the bottom wall 64 of the housing 50 so that they confront the secondary conductive body 74. These primary coils 78 and the secondary conductive body 74 constitute a linear motor 76 for rotating the rotation shaft 70 about its longitudinal axis.

Referring further to FIG. 2, a pair of support discs 80 and 82 are coaxially attached to the rotation shaft 70 at a vertical distance $D_1$. Between these support discs 80 and 82, a cylindrical support frame 86 is secured so that the rotation shaft 70 is concentrically surrounded by the support frame 86. This support frame 86 is provided with a plurality of parallel annular trays 88 fitting therearound at equal vertical spacings. As shown in FIG. 3, a plurality of radial plates 90 extend between adjoining two trays 88 so that every space between adjoining two trays 88 is divided by the radial plates 90 into a plurality of individual compartments 92 for storage of a work such as wafer cassette 44. That is to say, the support discs 80 and 82, the support frame 86, the trays 88 and the radial plates 90 constitute a rack assembly 84 which has a plurality of individual cassette compartments 92 opening radially outwards.

As shown in FIG. 3, a horizontal plate 94 for receiving a work thereon is secured to the inner face of the housing 50 in such a manner that the receiving plate 94 is positioned in the transfer chamber 56 and adjacent to the outer entrance 48. Also, in the transfer chamber 56, there is disposed a transfer mechanism 96 for transferring works between the receiving plate 94 and each cassette compartment 92 in the storage chamber 54. This transfer mechanism 96 includes a vertical guide rail 98, a slider 100, a horizontal arm 102 and a clamping hand 104. The guide rail 98 extends between the top and bottom walls 62 and 64 of the housing 50 in such a manner that it can be turned about its longitudinal axis. Suitable means such as a servomotor (not shown) is provided for turning the guide rail 98. The slider 100 is movably connected to the guide rail 98 for movement along the guide rail 98. Suitable means such as a lead screw and ball nut is interposed between the slider 100 and the guide rail 98 for driving the slider 100. The horizontal arm 102 extends horizontally from the slider 100. This arm 102 is of a telescopic structure and thus is horizontally extensible and contractible. The clamping hand 104 is attached to the distal end of the horizontal arm 102, and has a pair of spaced parallel fingers 106 movable toward and away from each other, whereby the clamping hand 104 is capable of releasably clamping a work between the fingers 106.

In order to store a work 44 in the storage cabinet thus constructed, the work 44 is put into the transfer chamber 56 through the outer entrance 48 and is placed on the receiving plate 94. Then, the transfer mechanism 96 is actuated to clamp the work 44 and thereby the work 44 is clamped by the clamping hand 104. Next, the clamping hand 104 is brought into a position in front of the inner entrance 46 by turning the guide rail 98, and then its level is adjusted by sliding the slider 100 so that it comes to a position at the same level as a desired vacant compartment 92. The horizontal arm 102 is then, extended toward the cassette compartment until the clamping hand 104 is brought into the cassette compartment 92. The fingers 106 are withdrawn from each other and thereby the work 44 is released onto that portion of the tray 88 in the cassette compartment 92. When all the compartments 92 in a vertical row facing the inner entrance 46 are filled with works 44 as other works 44 are brought into the cabinet one after another, the rotation shaft 70 is turned until another vertical row of available compartments 92 faces the inner entrance 46. Otherwise, the rotation shaft 70 may be turned every time a work 44 is put into a compartment 92. To withdraw a work 44 from the cabinet, the transfer mechanism 96 is operated in an opposite manner to the aforementioned operation.

As is mentioned above, since the outer entrance 48 is of such a size that the outer entrance 48 allows only one work 44 to pass therethrough, and since the storage chamber 54 is indirectly in communication with the outside of the housing 50 through the transfer chamber 56 in which air is kept constantly clean, outside dust is almost completely blocked from being brought into the storage chamber 54 upon the storing and withdrawing operation of the works 44. Also, since the bearings 72 have the sealing magnetic fluid units, and since the rotation shaft 70 is driven by the linear motor 76 which produces no dust, the cleanliness of the storage chamber 54 is kept at a higher level than that of the conventional storage cabinet. Consequently, the storage cabinet according to the present invention is capable of storing works with an extremely low potential of contamination by dust.

In place of the transfer mechanism 96, there may be employed a transporting robot proposed by some of the inventors of the present invention, in U.S. patent application Ser. No. 119,839, filed on Nov. 12, 1987, entitled "TRANSPORTING ROBOT FOR SEMICONDUCTOR WAFERS", currently under examination.

Figure 4:
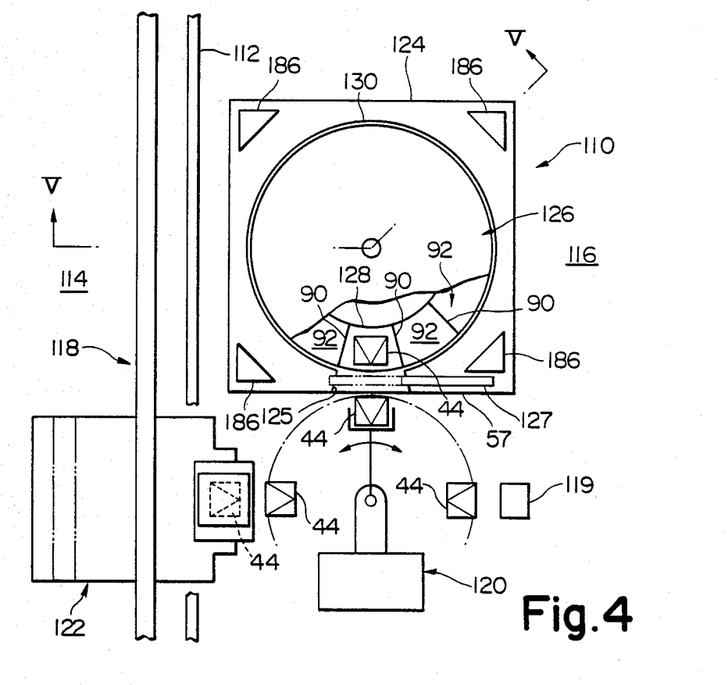
FIG. 4 is a schematic plan view, partly in section, of a clean room in which a storage cabinet apparatus of another embodiment of the present invention is installed.

Another embodiment of the present invention is illustrated in FIGS. 4 to 7. FIG. 4 shows a clean room in which a storage cabinet 110 of this embodiment is installed. The clean room is divided by a partition wall 112 into a passage area 114 and a work area 116. In the passage area 114, a railway carrier 118 is installed for transporting wafer cassettes 44 between several work areas. The storage cabinet 110 is located in the work area 116, together with a transporting robot 120 which transfers wafer cassettes 44 between the storage cabinet 110 and the railway carrier 118 and between the storage cabinet 110 and a turntable 119. A wafer cassette 44 placed on the turntable may be transported, by another robot, to apparatuses which process semiconductor wafers. Reference numeral 122 denotes a station assembly for shifting wafer cassettes 44 between the passage and work areas 114 and 116. The transporting robot 120 may be the one disclosed in the aforementioned U.S. patent application Ser. No. 119,839, filed Nov. 12, 1987, entitled "TRANSPORTING ROBOT FOR SEMICONDUCTOR WAFERS".

Figure 5:
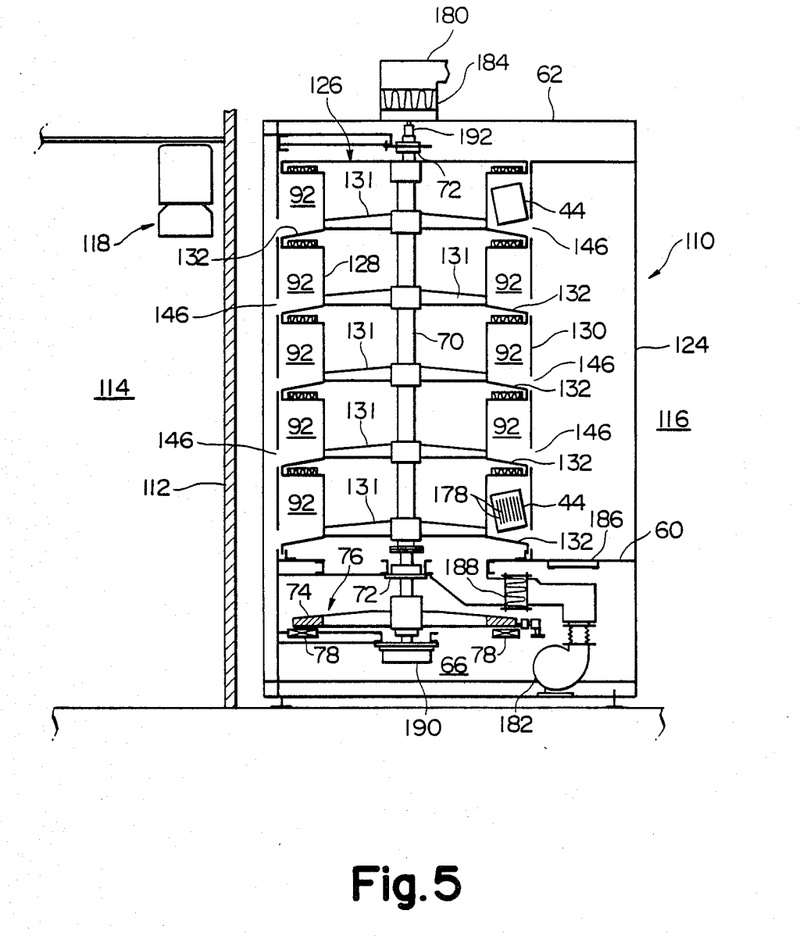
FIG. 5 is a view taken along the line V—V in FIG. 4.
Figure 6:
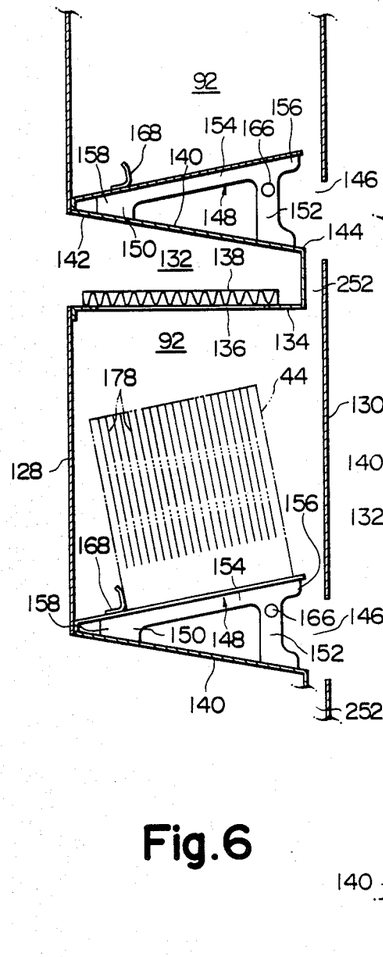
FIG. 6 is an enlarged vertical sectional view of cassette compartments in FIG. 5.

The housing 124 is a rectangular box-like structure without a transfer chamber. A vertically elongated entrance 125 is formed through the front and inner wall 57 and 130 of the housing 124. The vertical length of the entrance 125 is approximately as long as the height of a rack assembly 126 in the inner wall 130. A sliding door 127 is slidably connected to the front wall 57 for opening and closing the entrance 125. As shown in FIG. 5, the rack assembly 126 includes a cylindrical support frame 128 with a closed upper end and an open lower end. Through this open lower end, the inside of the support frame 128 is in communication with air supply means such as a blower 182 in the motor room 66. A plurality of radial arms 131 interconnect the support frame 128 fixedly and concentrically to the rotation shaft 70. A plurality of substantially parallel annular trays 132, each being of a hollow construction, are concentrically formed around the support frame 128 at equal vertical spacings. Each of the trays 132 is in communication with the inside of the support frame 128. As shown in FIG. 6, each of the cassette compartments 92 of the rack assembly 126 is provided with an air inlet 136 which is formed in the lower wall 134 of the tray 132 over the corresponding compartment 92, so that each of the cassette compartments 92 is in communication with the inside of the tray 132 through the air inlet 136. The air inlet 136 is covered by a flat-type HEPA or ULPA filter 138 through which air passing is filtrated. The upper wall 140 of each tray 132 is inclined to a horizontal plane in such a manner that the inner edge 142 of the upper wall 140 is positioned at a higher level than the outer peripheral edge 144 of the upper wall 140. That is to say, the upper wall 140 of each tray 132 serves as a guide plate for guiding air flow in the compartments 92 radially outward. Each cassette compartment 92 is provided with an air outlet 146 formed in the inner wall 130 of the housing 124 so that air flow guided by the upper wall 140 of a tray 132 passes out of the inner wall 130 through the air outlet 146. Each air outlet 146 is of a circumferentially extending slit-like configuration and is positioned adjacent to the lower section of a cassette compartments 92.

Figure 7:
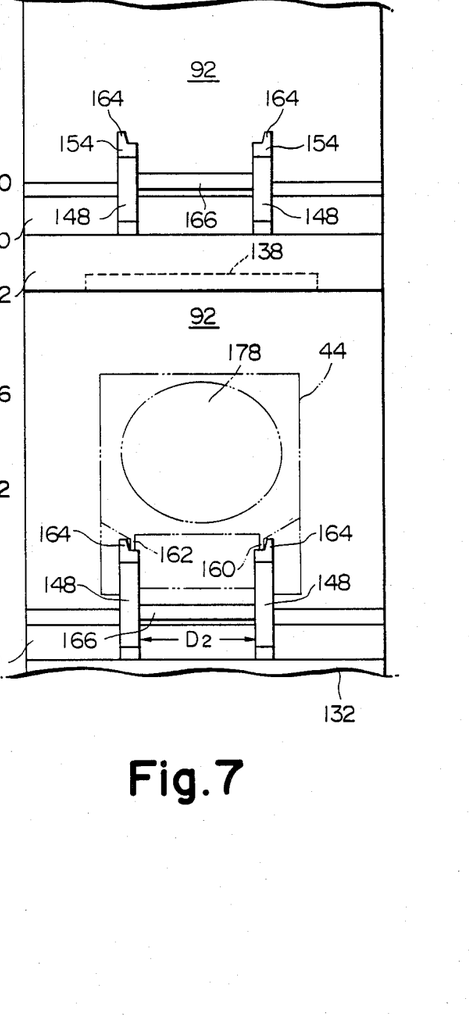
FIG. 7 is a front view of the cassette compartments in FIG. 6.

Each of the compartments 92 is further provided with a pair of supporting members 148 for supporting a work thereon. Each supporting member 148 consists of inner and outer legs 150 and 152 protruding upward from the upper wall 140 of the corresponding tray 132 and a bridging bar 154 bridging the distance between the top ends of the inner and outer legs 150 and 152. The outer leg 152 is located at a radially outer position to the inner leg 150 and has a length substantially longer than that of the inner leg 150. As a result, the bridging bar 154 is inclined to a horizontal plane in such a manner that the outer end 156 of the bridging bar 154 is positioned at a higher level than its inner end 158. As shown in FIG. 7, a pair of supporting members 148 in a compartment 92 are aligned parallel with a horizontal distance $D_2$ which is generally equal to the distance between the pair of leg portions 160 and 162 of a wafer cassette 44. Each of the bridging bars 154 is provided at its upper face with an engaging ridge 164 extending therealong. Consequently, it is possible to place a wafer cassette 44 on the pair of supporting members 148 with its leg portions 160 and 162 supported respectively by the upper faces of the bridging bars 154 and also with the wafer cassette's leg portions 160 and 162 engaged with the engaging ridges 164 of the bridging bars 154. Reference numeral 166 designates a horizontal connecting rod extending between the pair of supporting members 148. Also, reference numeral 168 designates a stop member attached to the bridging bars 154 for preventing a wafer cassette 44 on the supporting members 148 from slipping down the upper faces of the bridging bar 154.

Figure 8:
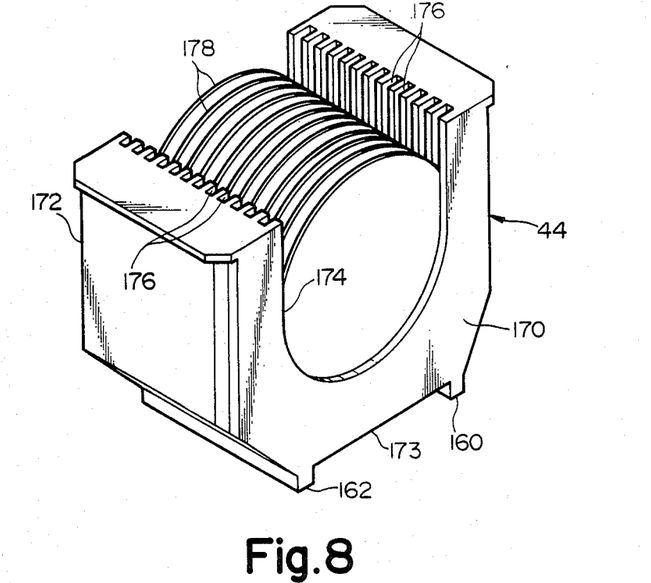
FIG. 8 is an enlarged perspective view of a wafer cassette in which a plurality of semiconductor wafers are contained.

In addition, as shown in FIG. 8 and stated above, the wafer cassette 44 generally used in handling semiconductor wafers, is a channel-shaped structure having a pair of elongated leg portions 160 and 162. The wafer cassette 44 has, U-shaped opposite end faces 170 and 172, closed bottom face 173 and curved inner face 174. The leg portions 160 and 162 are formed on the bottom face 173 so as to extend perpendicular to the end faces 170 and 172. A plurality of grooves 176 are formed in the inner face 174 of the cassette 44 in such a manner that when semiconductor wafers 178 are received in the grooves 176, the semiconductor wafers 178 are aligned parallel both to one another and to the end faces 170 and 172. Accordingly, when such a wafer cassette 44 shown in FIG. 8 is properly placed on the supporting members 148 in a compartment 92, the cassette-encased wafers 178 are, naturally, as shown in FIG. 7, inclined to a vertical plane.

Returning to FIG. 5, an air supply duct 180 which is in communication with the central air conditioner (not shown) of the clean room, is connected to the top wall 62 of the housing 124. Thus, by the clean air supplied to the housing 124 through the duct 180, the internal pressure of the housing 124 is maintained at a constant level which is higher than the atmospheric pressure. Reference numeral 184 denotes a HEPA or ULPA filter for filtrating air introduced into the housing 124. As shown in FIG. 4, four air vents 186 are formed respectively in those portions of the base panel 60 adjacent to the four corners of the housing 124. The blowers 182 in the motor room 66 are positioned adjacent to the four air vents 186 respectively and are in communication with the inner space of the support frame 128 through HEPA or ULPA filters 188. These blowers 182 maintain the internal pressure of the support frame 128 that is higher than the external pressure thereof. Reference numeral 190 designates a magnetic brake, disposed at the lower end of the rotation shaft 70, for braking the rotation shaft 70. Reference numeral 192 designates a rotary encoder, disposed at the upper end of the rotation shaft 70, for determining the revolution of the rotation shaft 70.

With this construction of the storage cabinet, the wafer cassettes 44 can, by opening the sliding door 127, be put into or withdrawn from the compartments 92 which are facing the entrance 125. These storing and withdrawing operations are naturally, achieved by the transporting robot 120. The desired compartments 92 can be brought to the position exactly in front of the entrance 125 by means of the linear motor 76, magnetic brake 190 and the rotary encoder 192.

Clean air introduced through the duct 180 into the housing 124 is drawn until the blowers 182 through the air vents 186, and, after being filtrated by the air filter 188, is supplied to the inside of the support frame 128. In the support frame 128, the supplied air is driven upward from the lower end to the top end, and then, is introduced into each tray 132. Next, the air is introduced into each cassette compartment 92 through the air filter 138 at the corresponding air inlet 136. In each compartment 92, the air is directed downward to the upper wall 140 of the tray 132, is guided by the upper wall 140 to the outlet 146 and then blown out of the inner wall 130. The discharged air from the inner wall 130 is, again drawn into the blowers 182 and circulates in the housing 124 in the same manner as is previously described. That is to say, an individual clean air flow, the same as the vertical laminar air flow of a clean room, is formed in each of the cassette compartments 92, and the dust occurring in the compartment 92 is immediately discharged from the compartment 92 through the air outlet 146. Consequently, there is no potential of the wafer cassettes stored in each compartment 92 being subjected to dust occurring in other sections of the housing 124. Furthermore, since each compartment 92 is adapted to contain a wafer cassette 44 with the cassette-encased semiconductor wafers 178 being substantially parallel to the direction of the air flow in the compartment 92, there does not arise the inconvenience of a turbulent air flow in the compartment 92. Since the compartments 92 facing the sliding door 127 are not provided with air outlets 146, not wafer cassettes with wafers but only vacant cassettes 44 may be stored in these compartments 92.

Figure 9:
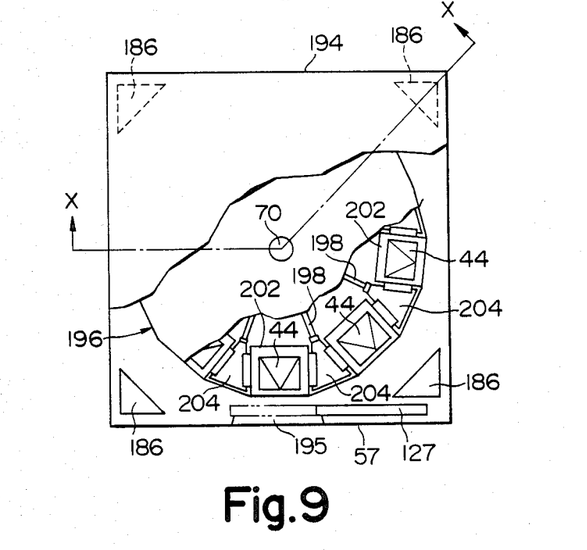
FIG. 9 is a schematic plan view, partly in section, of still another embodiment of the present invention.
Figure 10:
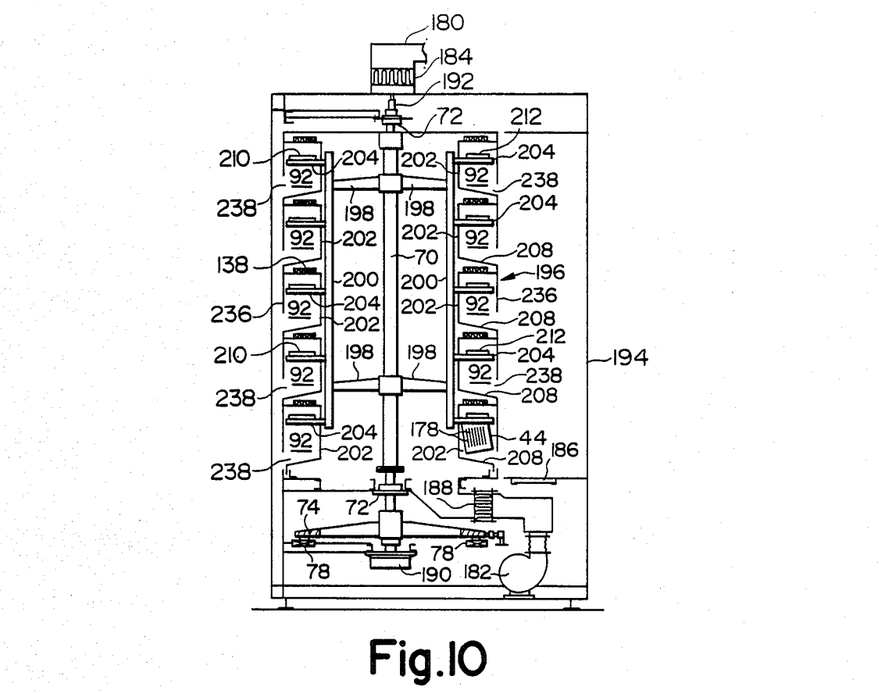
FIG. 10 is a view taken along the line X—X in FIG. 9.
Figure 11:
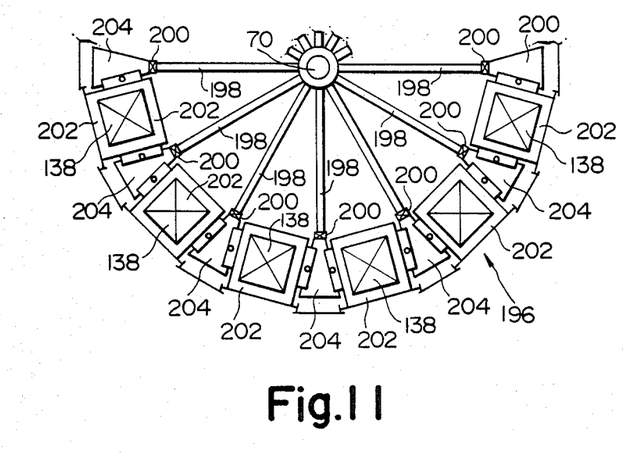
FIG. 11 is a fragmentary plan view of a rack assembly in FIG. 9.

Still another embodiment of the present invention is illustrated in FIGS. 9 to 15. As shown in FIGS. 9 and 10, a housing 194 does not have the cylindrical inner wall. Therefore, an entrance 195 is formed only through the front wall 57 of the housing 194, and a rack assembly 196 is disposed directly inside the housing 194. As shown in FIG. 11, this rack assembly 196 includes a plurality of radial arms 198, a plurality of vertical support rods 200 and a plurality of rack segments 202. The radial arms extend radially outward from the rotation shaft 70. The vertical support rods 200 are attached to the outer ends of the radial arms in such a manner that the vertical rods 200 concentrically surround the rotation shaft 70. A plurality of connecting plates 204 are secured to the outer face of each vertical rods 200 at equal vertical spacings. Each of the rack segments 202 is secured between the circumferentially adjoining two connecting plates 204.

Figure 12:
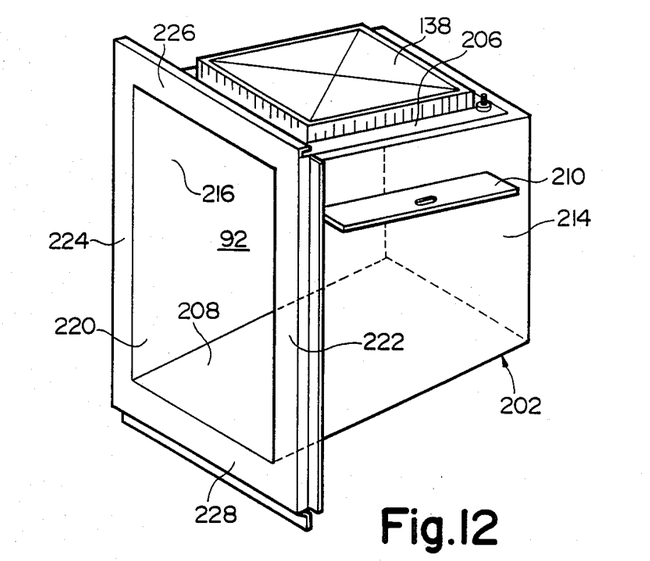
FIG. 12 is an enlarged perspective view of a rack segment in FIG. 9.

As shown in FIG. 12, each of the rack segments 202 is of a substantially rectangular box-like structure with an open outer end, the segment defining a cassette compartment 92 within it. This rack segment is fabricated, for example, by molding stainless steel into a one-piece structure or by assembling unit panels made of lightweight, antistatic plastic. An aperture serving as the air inlet 136 (see FIG. 14) is formed in the top wall 206 of the rack segment 202. The flat-type HEPA or ULPA filter 138 is secured to the top wall 206 so as to cover the aperture 136. The bottom wall 208 of the segment 202 is inclined relative to the top wall 206 so that upon the completion of the rack assembly's construction, the outer edge of the bottom wall 208 is positioned at a lower level than the inner edge of the bottom wall 208. A pair of supporting members 148 are mounted on the bottom wall 208 of the segment 202 in the same manner as the supporting members of the foregoing embodiment (see FIG. 14). A pair of side flanges 210 and 212 which are parallel to the top wall 206 of the segment 202 are projecting respectively from the opposite side walls 214 and 216 of the segment 202. A rectangular peripheral flange of window frame-like structure, which consists of opposite side strips 222 and 224 and upper and lower strips 226 and 228, is formed around the opening 220 of the segment 202.

Figure 13:
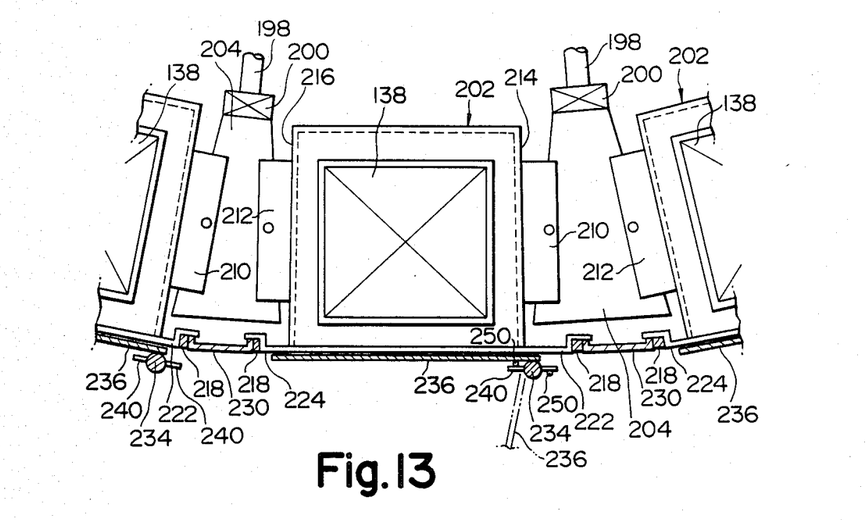
FIG. 13 is an enlarged fragmentary plan view of the rack assembly in FIG. 11.
Figure 14:
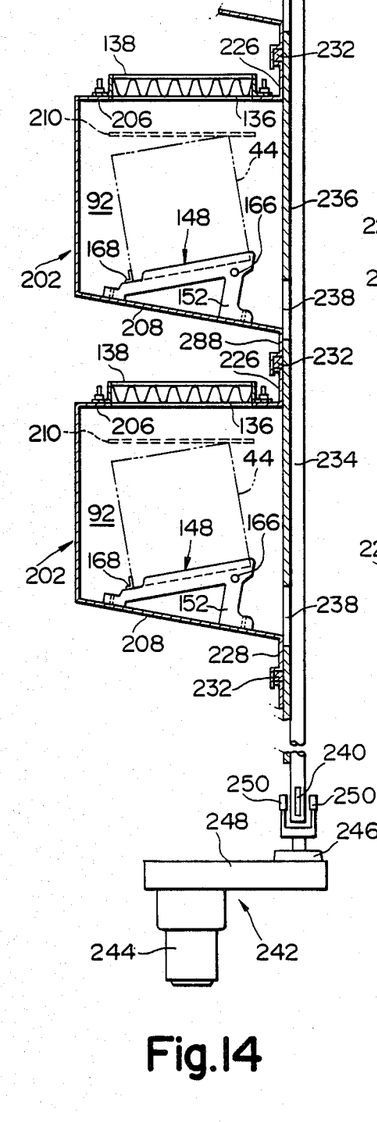
FIG. 14 is a fragmentary vertical sectional view of vertically aligned cassette compartments in FIG. 13.

As shown in FIG. 13, the side flanges 210 and 212 of each rack segment 202 are secured respectively to connecting plates 204 positioned at the opposite sides of the corresponding rack segment 202 thereby each segment 202 is supported on the connecting plates 204. The side strip 222 of each rack segment 202 is connected to the side strip 224 of the circumferentially adjoining rack segment 202, via a vertically extending slat 230. Sealing members 218 are disposed along the seams between the slat 230 and the respective side strips 222 and 224. As shown in FIG. 14, the upper strip 226 of each rack segment 202 is directly connected to the lower strip 228 of the upper adjoining rack segment 202. Also, a sealing member 232 (see FIG. 14) is disposed along the seam between each rack segment 202 and the upper adjoining rack segment 202. The plurality of rack segments 202 are, thus, assembled to form a substantially cylindrical structure having a plurality of cassette compartments 92 arranged in a latticework manner.

Figure 15:
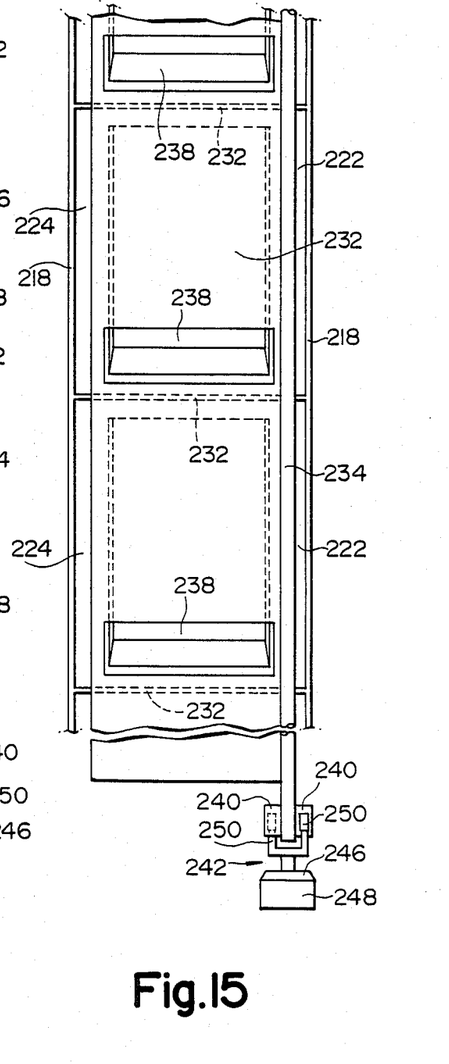
FIG. 15 is a fragmentary front view of the vertically aligned cassette compartments in FIG. 14.

As illustrated in FIGS. 13 to 15, every row of vertically aligned cassette segments 202 is provided with a swing door 236 connected to the side strips 222 thereof for turning about a vertical pivot 234. This swing door 236 consists of a vertically elongated plate such that all the openings 220 of vertically aligned segments 202 are covered by the swing door 236 when the door 236 is pivoted to the closed position shown by the solid line in FIG. 13. Horizontally elongated apertures 238 of the same number as vertically aligned segments 202 are formed in those portions of the swing door 236 in front of the lower sections of the cassette compartments 92 so that these apertures 238 serve as air outlets. Suitable means such as a coil spring is provided for urging the swing door into its closed position. A pair of blades 240 are attached to the lower end portion of the pivot 234 which is extended below the lower end of the rack assembly 196. These blades 240 extend in opposite radial directions from the pivot 234 so that they are substantially parallel to the swing door 236.

As shown in FIGS. 14 and 15, a drive mechanism 242 for pivoting the swing door 236 is provided, adjacent to the entrance 195 of the housing 194. This drive mechanism 242 has a servomotor 244 fixedly disposed in the motor room 66 of the housing 194. The servomotor 244 is drivingly connected via a timing belt 248 to a pulley 246 which is rotatably connected to the housing 194. A pair of engaging fingers 250 are drivingly attached to the pulley 246 so that they are located at a position into which the lower end portion of the pivot 234 is brought, when a row of vertically aligned segments 202 confronts the entrance 195 of the housing 194. Accordingly, when a row of rack segments 202 is brought to the position adjacent to the entrance 195, the lower portion of the corresponding door's pivot 234 is positioned between the engaging fingers 250. Therefore, by turning the fingers 250 counterclockwise in FIG. 13, the fingers 250 engage with the blades 240 of the pivot 234 and, then, turn the pivot 234 together with the swing door 236 to their opened position shown by the phantom line in FIG. 13. The door 236 can be closed by turning the fingers 250 clockwise. After the closing of the door 236, the rotation shaft 70 may be turned, and thereby the blades 240 of the door's pivot 234 are disengaged from the fingers 250 of the drive mechanism 242 and then, the blades 240 of another door's pivot 234 are brought to the position between the engaging fingers 250 of the drive mechanism 242.

With this construction, since the horizontal cross-section of a rack segment 202 is parallel with the rectangular air filter 138, an individual smooth flowing clean air flow in each of the compartment 92 is enhanced. Also, since the swing doors 236 are employed instead of the cylindrical inner wall 130 of the second embodiment, no passage such as clearances 252 in FIG. 6 is created between the adjoining compartments 92. Therefore, there is no possibility of an inconvenience of a cross contamination between the two or more compartments 92. Although in the second embodiment, it is not easy to clean the inner face of the inner wall 130, the inner faces of the swing doors 236 are easily cleaned by opening the door 236. Thus, cleanliness in the housing 194 is furthermore enhanced. In addition, the swing door 236 prevents its covered compartments 92 from yielding a turbulent flow of air when the compartments 92 confronts the entrance 195. This fact makes it possible to store the wafer cassettes 44 in the compartments facing the entrance 195.

Figure 16:
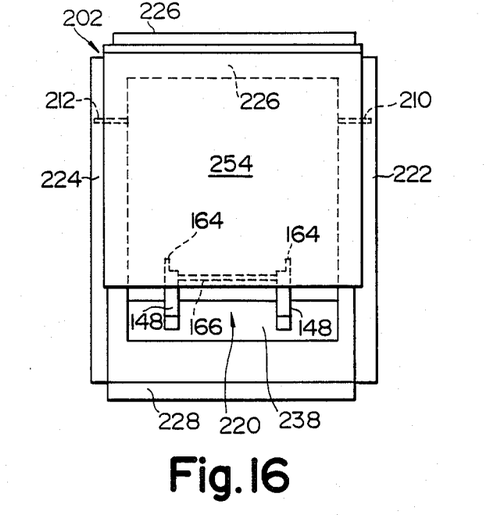
FIG. 16 is a front view of a rack segment in FIG. 15.
Figure 17:
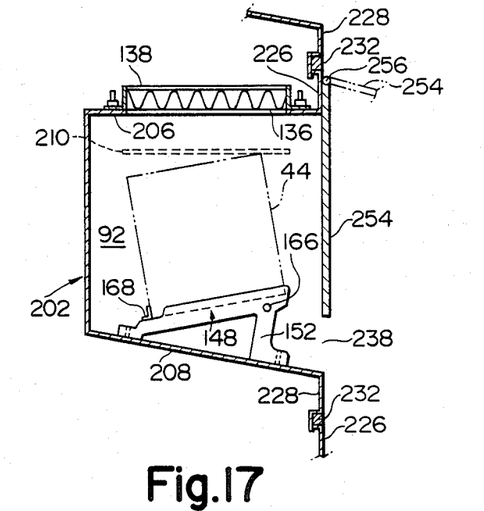
FIG. 17 is a vertical sectional view of the rack segment in FIG. 16.

A modified form of the rack segment in FIGS. 14 and 15 is illustrated in FIGS. 16 and 17, in which a swing door 254 merely covering the upper section of the segment's opening 220 is pivotally connected to the upper strip 226 of the segment 202 for movement about a horizontal pivot 256. The uncovered section of the opening 220 serves as the air outlet 238 of the compartment 92. Upon the storing or withdrawing operation of a wafer cassette 44, only the swing door 254 of the desired compartment 92 is opened, but are not the swing doors 254 of the other compartments 92 facing the entrance 195 of the housing 194. Consequently, the wafer cassettes stored in the compartments other than the desired compartment 92 are almost completely prevented from contamination by outside dust entering through the entrance 195.

Although in the foregoing embodiments, the storage cabinets are described as they are used for storing wafer cassettes 44 containing semiconductor wafers, these cabinets may be used for storing any other wafer cassettes of various types or for any other works which require a storage atmosphere of a high cleanliness level.

What is claimed is:

1. A dusttight storage cabinet apparatus for use in clean rooms, the storage cabinet apparatus being used for storing works which require a clean atmosphere, the storage cabinet apparatus comprising:

a housing having a front wall, the front wall having a first entrance for allowing works to come in and go out of the housing therethrough;

air supply means for supplying an inside of the housing with clean air so that cleanliness of the housing is maintained at a same level or higher level than that of the clean rooms;

a vertical rotation shaft rotatably disposed in the housing for turning about a longitudinal axis thereof;

first drive means for turning the rotation shaft; and a rack assembly of a substantially cylindrical structure coaxially secured to the rotation shaft, the rack assembly having a plurality of compartments, opening radially outward, for storing the works therewithin, the compartments being partitioned off from one another so as to prevent cross-contamination by dust thereamong, each of the compartments having an air inlet in communication with the air supply means so that clean air is introduced into each of the compartments through a corresponding air inlet, the air inlet having an air filter for filtrating air passing through the air inlet, the compartments further having means for covering upper portions of the opening of the compartments so that each of lower portions of the openings serves as an air outlet for each of the compartments.

2. A dusttight storage cabinet apparatus according to claim 1, said rack assembly having a cylindrical support frame concentrically connected to the rotation shaft; a plurality of parallel angular trays attached around the support frame at equal vertical spacings; and a plurality of radial plates extending between adjoining two trays so that every space between adjoining two trays is divided by the radial plates into a plurality of said compartments.

3. A dusttight storage cabinet apparatus according to claim 1, said rack assembly further including a plurality of rack segments connected to one another to form said substantially cylindrical structure, each of the rack segments comprising a substantially rectangular box-like structure with an open outer end, the box-like structure defining one of said compartments therewithin.

4. A dusttight storage cabinet apparatus according to claim 2, further comprising: a partition wall dividing the inside of the housing into a front chamber and a rear chamber, the front chamber being in communication with the outside of the housing through the first entrance, the rear chamber receiving the rotation shaft and the rack assembly, the partition wall having a second entrance for allowing works to go between the front and rear chambers therethrough whereby the rear chamber is in communication with the front chamber through the second entrance; and transfer means, disposed in the front chamber, for transporting works between the first entrance and rack assembly.

5. A dusttight storage cabinet apparatus according to claim 1, wherein the first drive means comprises a linear motor consisting of: an annular secondary conductive body coaxially attached to the rotation shaft; and a plurality of primary coils disposed in the housing in such a manner that the primary coils confront the secondary conductive body.

6. A dusttight storage cabinet apparatus according to claim 2 or 3, each of the compartments having upper and lower inner faces, said air inlet being formed in the upper inner face of each of the compartments so that air flow in each of the compartments is driven downward to the corresponding lower inner face, said lower inner face of each of the compartments sloping downwardly to the corresponding air outlets so as to smoothly guide the air flow toward the air outlet.

7. A dusttight storage cabinet apparatus according to claim 6, said covering means including a cylindrical inner wall concentrically surrounding the rack assembly, the inner wall having a third entrance, formed in that portion of the inner wall adjacent to the first entrance of the housing, for allowing works to go therethrough; and a plurality of apertures formed in those portions of the inner wall in front of the compartments so that the apertures allow the lower portions of the opening of the compartments to be kept open.

8. A dusttight storage cabinet apparatus according to claim 7, said first drive means including a linear motor having an annular secondary conductive body coaxially attached to the rotation shaft, and a plurality of primary coils disposed in the housing in such a manner that the primary coils confront the secondary conductive body.

9. A dusttight storage cabinet apparatus according to claim 6, wherein the covering means comprises a plurality of swing doors, each swing door being pivotally connected to the rack assembly in such a manner that the openings of one or more of the compartments are opened and closed by the pivotal movement of each of the swing doors.

10. A dusttight storage cabinet apparatus according to claim 9, wherein each of the swing doors has one or more apertures for allowing the lower portions of the openings of the corresponding compartments to be kept open.

11. A dusttight storage cabinet apparatus according to claim 10, further comprising second drive means for pivoting the swing doors.

12. A dusttight storage cabinet apparatus according to claim 13, wherein the first drive means comprises a linear motor consisting of: an annular secondary conductive body coaxially attached to the rotation shaft; and a plurality of primary coils disposed in the housing in such a manner that the primary coils confront the secondary conductive body.

13. A dust tight storage cabinet apparatus according to claim 2, said first drive means including a linear motor having an annular secondary conductive body coaxially attached to the rotation shaft, and a plurality of primary coils disposed in the housing in such a manner that the primary coils confront the secondary conductive body.

14. A dusttight storage cabinet apparatus for use in clean rooms, the storage cabinet apparatus being used for storing works which require a clean atmosphere, the storage cabinet apparatus comprising:
- a housing having a front wall, the front wall having a first entrance for allowing works to come in and go out of the housing therethrough;
- air supply means for supplying an inside of the housing with clean air so that cleanliness of the housing is maintained at a same level or higher level than that of the clean rooms;
- a vertical rotation shaft rotatably disposed in the housing for turning about a longitudinal axis thereof;
- a linear motor for turning the rotation shaft, said linear motor having an annular secondary conductive body coaxially attached to the rotation shaft, and a plurality of primary coils disposed in the housing in such a manner that the primary coils confront the secondary conductive body; and
- a rack assembly of a substantially cylindrical structure coaxially secured to the rotation shaft, the rack assembly having a plurality of compartments opening radially outward, for storing the works therewith, the compartments being partitioned off from one another so as to prevent cross-contamination by dust thereamong.

15. A dusttight storage cabinet apparatus according to claim 14, further comprising a partition wall dividing the inside of the housing into a front chamber and a rear chamber and a transfer means disposed in the front chamber for transporting works between the first entrance and the rack assembly, the transfer means comprising: a vertical guide rail rotatably disposed in the front chamber for turning about a longitudinal axis thereof; a slider member slidably connected to the guide rail for movement along the guide rail; a horizontal arm extending horizontally from the slider member, the horizontal arm being of a telescopic structure such that the horizontal arm is horizontally extensible and contractible; and a clamping hand, attached to the distal end of the horizontal arm, for releasably clamping the works.

* * * * *

UNITED STATES PATENT AND TRADEMARK OFFICE
CERTIFICATE OF CORRECTION

PATENT NO.  : 4,867,629
DATED       : September 19, 1989
INVENTOR(S) : Yoshiyuki Iwasawa, et al.

It is certified that error appears in the above-identified patent and that said Letters Patent is hereby corrected as shown below:

Column 1, line 48: "2" should read as --32--

Column 2, line 32: "dust tight" should read as --dusttight--

Column 8, line 56: "until" should read as --into--

Column 13, line 12, Claim 12: "to claim 13" should read as --to claim 11--

Column 14, line 16, Claim 14: "therewith" should read as --therewithin--

Signed and Sealed this

Nineteenth Day of November, 1991

Attest:

HARRY F. MANBECK, JR.

*Attesting Officer*   *Commissioner of Patents and Trademarks*